US006379576B2

(12) United States Patent
Luo et al.

(10) Patent No.: US 6,379,576 B2
(45) Date of Patent: *Apr. 30, 2002

(54) SYSTEMS AND METHODS FOR VARIABLE MODE PLASMA ENHANCED PROCESSING OF SEMICONDUCTOR WAFERS

(75) Inventors: Leroy Luo, Fremont; Rene George, San Jose; Stephen E. Savas, Alameda; Craig Ranft, Fremont, all of CA (US); Wolfgang Helle, Munich (DE); Robert Guerra, Fremont, CA (US)

(73) Assignee: Mattson Technology, Inc., Fremont, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/192,810

(22) Filed: Nov. 16, 1998

Related U.S. Application Data

(60) Provisional application No. 60/067,919, filed on Nov. 17, 1997.

(51) Int. Cl.[7] .................................................. C23F 1/00
(52) U.S. Cl. ..................... 216/67; 216/68; 156/345; 438/725; 118/723; 118/723 E
(58) Field of Search .................. 156/345; 216/68, 216/67; 438/725, 906; 118/723, 723 E, 723 ER

(56) References Cited

U.S. PATENT DOCUMENTS

| | | | |
|---|---|---|---|
| 3,951,843 A | 4/1976 | Jacob | 252/187 |
| 4,201,579 A | 5/1980 | Robinson et al. | 430/323 |
| 4,263,088 A | 4/1981 | Gorin | 156/626 |
| 4,361,461 A | 11/1982 | Chang | 156/643 |
| 4,370,195 A | 1/1983 | Halon et al. | 156/643 |
| 4,462,863 A | 7/1984 | Nishimatsu et al. | 156/643 |
| 4,501,061 A | 2/1985 | Wonnacott | 29/591 |
| 4,511,430 A | 4/1985 | Chen et al. | 156/643 |
| 4,529,860 A | 7/1985 | Robb | 219/121 |
| 4,557,796 A | 12/1985 | Druschke et al. | 156/643 |
| 4,618,398 A | 10/1986 | Nawata et al. | 156/643 |
| 4,673,456 A | 6/1987 | Spencer et al. | 156/345 |
| 4,678,539 A | 7/1987 | Tomita et al. | 156/643 |
| 4,711,698 A | 12/1987 | Douglas | 156/643 |
| 4,812,201 A | 3/1989 | Sakai et al. | 156/643 |
| 4,857,140 A | 8/1989 | Loewenstein | 156/643 |
| 4,918,031 A | 4/1990 | Flamm et al. | 437/225 |
| 4,933,300 A | 6/1990 | Koinuma et al. | 437/110 |
| 4,935,661 A | 6/1990 | Heinecke et al. | 313/231.31 |
| 4,938,839 A | 7/1990 | Fujimura et al. | 156/628 |
| 4,961,820 A | 10/1990 | Shinagawa et al. | 156/643 |
| 4,980,022 A | 12/1990 | Fujimura | 156/643 |
| 5,037,506 A | 8/1991 | Gupta et al. | 156/643 |
| 5,057,187 A | 10/1991 | Shinagawa et al. | 156/643 |
| 5,068,040 A | 11/1991 | Jackson | 210/748 |
| 5,138,973 A | 8/1992 | Davis et al. | 118/723 |

(List continued on next page.)

FOREIGN PATENT DOCUMENTS

| | | | |
|---|---|---|---|
| JP | 55-064233 | 5/1980 | G03C/5/00 |
| JP | 58-214149 | 12/1983 | G03C/5/00 |
| JP | 63-217629 | 6/1987 | H01L/21/302 |
| JP | 2-222468 | 9/1990 | C09D/9/00 |
| WO | WO94/20587 | 9/1994 | C09K/5/04 |

OTHER PUBLICATIONS

Daniel L. Flamm et al., "The Design of Plasma Etchants," *Plasma Chemistry and Plasma Processing*, vol. 1, No. 4, 1981, pp. 317–363.

M.C. Peignon et al. " A Kinetic Study of Reactive Ion Etching of Tungsten in $SF_6\backslash O_2$ RF Plasmas," *Journal of the Electrochemical Society*, vol. 140, No. 2, Feb. 1993, pp. 505–512.

H. Namatsu et al. "Hydrocarbon–Oxygen Mixture as a Resist Etching Gas with Highly Anisotropic Etching Features," *Journal of Electrochemical Society*, vol. 100, No. 2, Feb. 1983, pp. 523–525.

P. Singer et al. "Plasma Etch: A Matter of Fine–Tuning," *Semiconductor International*, Dec. 1995, pp. 65–68.

K. Katayama, et al. "A Study of Highly Selective Oxide Etching by ECR [Electron–Cyclotron Resonance] Plasma," *The Electrochemical Society*, vol. 93, No. 21, (1993) pp. 201–207.

L.P. Andersson et al. "Initial Etching in an RF Butane Plasma," *Journal of Vacuum Science and Technology*, vol. 28, No. 10/11 (1978) pp. 449–451.

L.A. Pederson et al. "Structural Composition of Polymers Relative to Their Plasma Etch Characteristics," *Journal of the Electrochemical Society*, vol. 129, No. 1, Jan. 1982, pp. 205–208.

K. Hirose et al. "Ion–Implanted Photoresist and Damage–Free Stripping," *Journal of the Electrochemical Society*, vol. 141, No. 1, Jan. 1994, pp. 192–205.

U.S. Patent Application No. 08/727,209 filed Oct. 13, 1995, Savas, "Apparatus and Method for Pulsed Processing of a Semiconductor Substrate".

U.S. Patent Application No. 08/811,893 filed Mar. 6, 1996, Savas, ICP Reactor Having a Conically–Shaped Plasma–Generating Section.

*Primary Examiner*—Randy Gulakowski
*Assistant Examiner*—M. Kornakov
(74) *Attorney, Agent, or Firm*—Wilson Sonsini Goodrich & Rosati

(57) ABSTRACT

Variable mode plasma system and method for processing a semiconductor wafer. The modulation of the plasma potential relative to the semiconductor wafer is varied for different process steps. A capacitive shield may be selectively grounded to vary the level of capacitive coupling and modulation of the plasma. Process pressures, gases and power level may also be modified for different process steps. Plasma properties may easily be tailored to specific layers and materials being processed on the surface of the wafer. Variable mode processes may be adapted for (i) removal of photoresist after high-dose ion implant, (ii) post metal etch polymer removal, (iii) via clean, and (iv) other plasma enhanced processes.

40 Claims, 7 Drawing Sheets

U.S. PATENT DOCUMENTS

| | | | |
|---|---|---|---|
| 5,147,499 A | 9/1992 | Szwejkowski et al. | 156/643 |
| 5,160,408 A | 11/1992 | Long | 156/656 |
| 5,174,856 A | 12/1992 | Hwang et al. | 156/643 |
| 5,176,790 A | 1/1993 | Arleo et al. | 156/643 |
| 5,198,634 A | 3/1993 | Mattson et al. | 219/121.43 |
| 5,200,031 A | 4/1993 | Latchford et al. | 156/659.1 |
| 5,200,361 A | 4/1993 | Onishi | 437/194 |
| 5,201,990 A * | 4/1993 | Chang | 156/643 |
| 5,217,560 A | 6/1993 | Kurono et al. | 156/345 |
| 5,221,424 A | 6/1993 | Rhoades | 156/643 |
| 5,226,056 A | 7/1993 | Kikuchi et al. | 373/18 |
| 5,227,341 A | 7/1993 | Kamide et al. | 437/229 |
| 5,228,052 A | 7/1993 | Kikuchi et al. | 373/18 |
| 5,234,529 A | 8/1993 | Johnson | 156/345 |
| 5,262,279 A | 11/1993 | Tsang et al. | 430/311 |
| 5,294,292 A | 3/1994 | Yamashita et al. | 156/643 |
| 5,296,093 A | 3/1994 | Szwejkowski et al. | 156/643 |
| 5,300,460 A | 4/1994 | Collins et al. | 437/225 |
| 5,310,456 A | 5/1994 | Kadomura | 156/657 |
| 5,310,703 A | 5/1994 | Visser et al. | 437/229 |
| 5,350,480 A | 9/1994 | Gray | 156/345 |
| 5,354,417 A | 10/1994 | Cheung et al. | 156/643 |
| 5,356,478 A | 10/1994 | Chen et al. | 134/1 |
| 5,362,358 A | 11/1994 | Yamagata et al. | 156/643 |
| 5,382,316 A | 1/1995 | Hills et al. | 156/643 |
| 5,384,167 A | 1/1995 | Nishiwaki et al. | 427/569 |
| 5,393,374 A | 2/1995 | Sato et al. | 156/643 |
| 5,399,237 A | 3/1995 | Keswick et al. | 156/643 |
| 5,403,434 A | 4/1995 | Moslehi | 156/643 |
| 5,403,436 A | 4/1995 | Fujimura et al. | 156/643 |
| 5,411,631 A | 5/1995 | Hori et al. | 216/13 |
| 5,419,805 A | 5/1995 | Jolly | 156/643.1 |
| 5,449,432 A | 9/1995 | Hanawa | 156/643.1 |
| 5,449,433 A | 9/1995 | Donohoe | 156/643.1 |
| 5,451,293 A | 9/1995 | Tabara | 216/13 |
| 5,462,635 A | 10/1995 | Ono et al. | 216/67 |
| 5,514,247 A | 5/1996 | Shan et al. | 156/643.1 |
| 5,534,231 A | 7/1996 | Savas | 216/67 |
| 5,556,521 A | 9/1996 | Ghanbari | 204/192.32 |
| 5,567,271 A | 10/1996 | Chu et al. | 156/659.11 |
| 5,571,366 A | 11/1996 | Ishii et al. | 156/345 |
| 5,614,060 A | 3/1997 | Hanawa | 156/643.1 |
| 5,628,871 A | 5/1997 | Shinagawa | 438/514 |
| 5,641,382 A | 6/1997 | Shih et al. | 438/669 |
| 5,647,913 A | 7/1997 | Blalock | 118/723.1 |
| 5,667,630 A | 9/1997 | Lo | 438/653 |
| 5,674,357 A | 10/1997 | Sun et al. | 156/659.11 |
| 5,690,781 A | 11/1997 | Yoshida et al. | 156/345 |
| 5,691,117 A | 11/1997 | Lutsic et al. | 430/329 |
| 5,696,428 A | 12/1997 | Pasch | 315/111.21 |
| 5,702,689 A | 12/1997 | Chien et al. | 430/313 |
| 5,747,387 A | 5/1998 | Koizumi et al. | 438/708 |
| 5,756,400 A * | 5/1998 | Ye | 438/710 |
| 5,811,022 A | 9/1998 | Savas et al. | 216/68 |
| 5,824,604 A | 10/1998 | Bar-Gadda | 438/725 |
| 5,983,828 A * | 11/1999 | Savas | 118/723 |

* cited by examiner

| Process Step | Description | Time (Secs.) | RF Time (Secs.) | RF Delay (Secs.) | Power (Watts) | Pressure (Torr) | O$_2$ (SCCM) | Forming Gas (SCCM) | CF$_4$ (SCCM) | Temp. (°C) | Shield Switch 132 | Support Switch 110 |
|---|---|---|---|---|---|---|---|---|---|---|---|---|
| 1 | Stabilization | 5 | 0 | 0 | 0 | 8 | 5,000 | | 90 | 85 | Open (Floating) | Closed (Grounded) |
| 2 | Crust Etch | 85 | 75 | 10 | 800 | 1.1 | 1,500 | 1,400 | 90 | 85 | Open (Floating) | Closed (Grounded) |
| 3 | Ashing | 75 | 75 | 0 | 1,100 | 0.6 | 1,500 | 1,400 | 90 | 85 | Closed (Grounded) | Open (Floating) |
| 4 | Post Process | 5 | 0 | 0 | 0 | 8 | 5,000 | 0 | 0 | 85 | Open (Floating) | Closed (Grounded) |

FIGURE 3A

| Process Step | Description | Time (Secs.) | RF Time (Secs.) | RF Delay (Secs.) | Power (Watts) | Pressure (Torr) | O₂ (SCCM) | Forming Gas (SCCM) | CF₄ (SCCM) | Temp. (°C) | Shield Switch 132 | Support Switch 110 |
|---|---|---|---|---|---|---|---|---|---|---|---|---|
| 1 | Stabilization | 5 | 0 | 0 | 0 | 8 | 2,300 | 600 | 90 | 85 | Open (Floating) | Closed (Grounded) |
| 2 | Crust Etch | 115 | 105 | 10 | 1,000 | 1.1 | 2,300 | 600 | 90 | 85 | Open (Floating) | Closed (Grounded) |
| 3 | Ashing | 75 | 75 | 0 | 1,200 | 0.6 | 2,300 | 600 | 90 | 85 | Closed (Grounded) | Open (Floating) |
| 4 | Post Process | 5 | 0 | 0 | 0 | 8 | 5,000 | 0 | 0 | 85 | Open (Floating) | Closed (Grounded) |

FIGURE 3B

| Process Step | Description | Time (Secs.) | RF Time (Secs.) | RF Delay (Secs.) | Power (Watts) | Pressure (Torr) | $O_2$ (SCCM) | Forming Gas (SCCM) | $CF_4$ (SCCM) | Temp. (°C) | Shield Switch 132 | Support Switch 110 |
|---|---|---|---|---|---|---|---|---|---|---|---|---|
| 1 | Stabilization | 6 | 2 | 4 | 850 | 1.1 | 0 | 500 | 300 | 75 | Open (Floating) | Closed (Grounded) |
| 2 | Polymer Etch | 20 | 20 | 0 | 650 | 2.5 | 0 | 1,900 | 300 | 75 | Open (Floating) | Closed (Grounded) |
| 3 | Bulk Resist Strip | 46 | 46 | 0 | 1,150 | 0.6 | 3,000 | 0 | 150 | 75 | Closed (Grounded) | Open (Floating) |
| 4 | Residue Removal | 30 | 30 | 0 | 650 | 2.5 | 0 | 1,900 | 300 | 75 | Open (Floating) | Closed (Grounded) |
| 5 | Post Process | 5 | 0 | 0 | 0 | 1.1 | 3,500 | 0 | 0 | 75 | Open (Floating) | Closed (Grounded) |

FIGURE 4

| Process Step | Description | Time (Secs.) | RF Time (Secs.) | RF Delay (Secs.) | Power (Watts) | Pressure (Torr) | O₂ (SCCM) | Forming Gas (SCCM) | NF₃ (SCCM) | Temp. (°C) | Shield Switch 132 | Support Switch 110 |
|---|---|---|---|---|---|---|---|---|---|---|---|---|
| 1 | Stabilization | 5 | 0 | 0 | 0 | 8 | 5,000 | 0 | 0 | 25 | Open (Floating) | Closed (Grounded) |
| 2 | Etch | 75 | 65 | 10 | 800 | 0.7 | 3,000 | 0 | 30 | 25 | Open (Floating) | Closed (Grounded) |
| 3 | Post Process | 5 | 0 | 0 | 0 | 8 | 5,000 | 0 | 0 | 25 | Open (Floating) | Closed (Grounded) |

FIGURE 5

SYSTEMS AND METHODS FOR VARIABLE MODE PLASMA ENHANCED PROCESSING OF SEMICONDUCTOR WAFERS

REFERENCE TO RELATED APPLICATIONS

The present application claims priority from provisional application No. 60/067,919 filed Nov. 17, 1997. Provisional application No. 60/067,919 is hereby incorporated herein by reference in its entirety. The present application also hereby incorporates by reference in its entirety U.S. patent application entitled "Downstream Surface Cleaning Process" by Craig Ranft, Wolfgang Helle, Robert Guerra and Brady F. Cole, being filed concurrently herewith on Nov. 16, 1998.

BACKGROUND

1. Field of the Invention

The field of the present invention relates in general to semiconductor processing. More particularly, the field of the invention relates to systems and methods for variable mode plasma enhanced processing of semiconductor wafers.

2. Background

During computer chip manufacturing, various materials are deposited onto a silicon wafer to convert the silicon wafer into a functional integrated circuit device. For instance, a bare silicon wafer may be masked with materials such as silica (silicon oxide or oxide), silicon nitride, and photoresist to protect areas on the wafer during different process steps. Subsequent to various processing steps, materials need to be removed from the surface of the wafer. Aggressive plasma enhanced processing may be desired to remove material quickly and completely, but may expose the wafer to damage.

While such difficulties may be encountered in a variety of processes, the removal of photoresist after high-dose ion implant is illustrative. Photoresist is exposed to a number of process steps that change the nature and physical qualities of the photoresist during the time that it is present on a wafer. A simplified discussion of how a semiconductor gate oxide device is formed illustrates how photoresist is used and how its characteristics are changed during use.

To form a semiconductor gate oxide device, a thick layer of oxide is usually grown on the surface of the silicon wafer. Photoresist is spun onto the oxide layer and patterned using ultraviolet light and a patterning mask, and the photoresist is subsequently developed to provide protected oxide areas and unprotected oxide areas. In a commercial process, the photoresist is developed rapidly, which usually traps some of the solvent in which the photoresist was suspended below the cured surface.

After developing the patterned photoresist, oxide is removed from the unprotected areas using reactive-ion etching, for example. Once the desired oxide pattern is established, metal species such as ions, free radicals, other energetic species, or other metal atoms are implanted into silicon underlying the patterned oxide to form the gate in the semiconductor device. This process is often referred to as high-dose ion implant. Metal species are driven through the oxide and into the silicon to a desired concentration and depth using a selected dose of metal species and high energy, and these species are also unavoidably driven into the photoresist during this process. It has been theorized that these species modify the photoresist by providing sufficient energy to drive hydrogen out of the photoresist and form double- and triple-bonded carbon atoms in the surface layer of the photoresist, creating a hardened crust and making the photoresist difficult to remove.

To complete the semiconductor gate oxide device, the contacts of the device are metalized, and the photoresist is removed from the wafer. It is highly desirable to remove the photoresist with high selectivity and minimal disturbance to the Si, $SiO_2$, $Si_3N_4$, metal, and other structural and/or masking materials present on the wafer so that device performance and reliability are ensured and so that further processing of the wafer remains uncomplicated by the resist strip. However, photoresist usually becomes very difficult to remove as a result of the numerous processing steps to which it is exposed. A number of methods have been developed in an attempt to remove this hardened and changed photoresist.

One method of removing photoresist (stripping) is a wet-chemical method as exemplified by Japanese patent application JP 55064233. In this method, a wafer having a photoresist layer is washed with a chlorinated aliphatic hydrocarbon and lower alkanol. The wafer must be washed and dried after stripping the photoresist with the chlorinated hydrocarbon and alcohol mixture, which increases the number of steps required to process wafers and consequently increases the time required to process wafers.

Another method of stripping photoresist from a wafer is a dry method that utilizes the reactive species created in a dry plasma to react with photoresist and strip it from the surface of the wafer. In a commonly-used commercial process, photoresist is removed in two steps. First, a plasma of oxygen and forming gas (a nonexplosive mixture of nitrogen and hydrogen gases) is created, and the plasma products are passed over the photoresist layer on the wafer at a temperature of approximately 150° C. for approximately 5–20 minutes to remove the layer of crust from the surface. This step usually produces only partial removal of the crust. After this first step, a plasma formed from oxygen or a mixture of oxygen and nitrogen is passed over the wafer for 1–2 minutes and at a temperature of approximately 250° C. to remove the remaining photoresist.

Conventional plasma systems designed to minimize damage to the wafer rely primarily on oxygen atoms and other disassociated neutral species to remove photoresist. Typically such systems are designed so that the charged, energetic species produced by the plasma tend to recombine prior to contact with the wafer or are isolated from the wafer in order to minimize potential damage to the wafer surface. The wafer is especially sensitive to damage from charged, energetic species during the final phase of photoresist removal when the areas of the wafer previously covered by the photoresist are exposed. While reducing exposure to charged, energetic species reduces the potential for damage to the wafer, it also makes it difficult to remove the hardened crust of the resist formed from high-dose ion implant.

What is needed is a system and method for varying the properties of a plasma for variable mode processing of a semiconductor wafer. Preferably, such a system and method would allow more aggressive plasma properties to be used for selected processing steps, such as removal of hardened photoresist crust, and less aggressive plasma properties to be used for more sensitive steps. Preferably, the plasma properties may be modified using a simple switch without interrupting processing.

SUMMARY OF THE INVENTION

Aspects of the present invention provide a system and method for selectively varying plasma properties for processing of a semiconductor wafer. In an exemplary embodiment, the modulation of the plasma potential relative to a semiconductor wafer may be varied for, different process steps. In the exemplary embodiment, a capacitive shield may be selectively grounded to vary the level of capacitive coupling and modulation of the plasma. In addition, the process pressure, gases, and power level may be modified to modify the plasma properties for different process steps. It is an advantage of these and other aspects of the present invention that plasma properties may be substantially modified without interrupting processing. The plasma properties may be tailored to the specific layers and materials being processed on the surface of the semiconductor wafer throughout the processing cycle.

Another aspect of the present invention provides an inductively coupled plasma reactor with variable capacitive shielding to control the properties of the plasma. In one embodiment, a split-or slotted capacitive shield (also referred to as a split Faraday shield) is provided between the induction coil and reactor chamber. When the shield is ungrounded relative to the induction coil (i.e., floating), a high energy plasma is formed and energetic charged species are driven toward the surface of the semiconductor wafer. This mode of operation may be used to rapidly remove layers from the surface of a semiconductor wafer. In particular, hardened layers, such as a photoresist crust, may be removed.

Grounding the shield reduces the capacitive coupling between the coil and the plasma. Without capacitive coupling driving the charged species toward the wafer surface, the plasma retracts and the density of the energetic, charged species is reduced. Nevertheless, abundant disassociated neutral species are produced in the plasma which diffuse over the wafer surface. This mode of operation may be used to remove layers of material from sensitive areas of the wafer. In particular, softer underlying layers of photoresist may be removed without damaging the semiconductor device.

Alternative mechanisms for varying capacitive shielding may also be used. For instance, a shield may be moved radially away from the reactor chamber to increase the size of the slots and decrease the level of shielding. In addition, the shield may be raised or lowered to remove all or part of the shielding. The width of the slots in the shield may also be increased or decreased by rotating an inner shield to overlap a portion of the slots. A sliding door or other mechanism may also be used. In addition, the inductor may remain shielded and an RF bias may be selectively applied to the wafer support to induce capacitive coupling. An RF bias may also be selectively applied to the shield to induce capacitive coupling.

Capacitive coupling and/or modulation of the plasma potential may also be modified in some embodiments without the use of variable capacitive shielding. For instance, a relatively high level of capacitive coupling may be provided by an inductor adjacent to a plasma generation chamber. The capacitive coupling may be reduced by raising the inductor above the chamber, so that the inductor is not aligned in a plane adjacent to the plasma. The power to the inductor may need to be increased, so inductive fields extending radially below the inductor are sufficient to sustain the plasma. Nevertheless, capacitive coupling is reduced.

It is an advantage of these and other aspects of the present invention that the properties of a plasma may easily be modified without interrupting processing. In particular, plasmas with different properties may be used to remove different layers on a semiconductor wafer without extinguishing the plasma or requiring two different process chambers.

Of course, in alternate embodiments, two different reactors with different plasma properties could be used to remove the different layers of material. A reactor with an energetic plasma, such as a capacitive diode reactor or an unshielded or partially shielded inductively coupled reactor, could be used to remove hardened layers of material. A reactor with a lower energy plasma isolated from the semiconductor wafer surface, such as a shielded inductively coupled reactor with a charged particle filter, could be used to remove more sensitive layers.

Aspects of the present invention also provide a system and method for rapidly removing both hard and underlying soft layers of materials from the surface of a semiconductor wafer while reducing the potential for damaging underlying areas of the semiconductor wafer. The surface of the semiconductor wafer is exposed to charged, energetic species from a plasma to remove hardened layers, such as a photoresist crust hardened from high-dose ion implant. After the hardened layers are removed, modulation of the plasma potential relative to the wafer is reduced which, in turn, reduces bombardment of the wafer by charged, energetic species. In addition, the density of charged species may be reduced. The softer underlying layer of material is removed in large part by reactions with disassociated neutral species which diffuse over the wafer rather than by high energy bombardment with charged species.

It is an advantage of these and other aspects of the present invention that a layer of material covered by a hardened crust may be rapidly removed from the surface of a semiconductor wafer without damaging sensitive underlying areas of the semiconductor wafer.

Aspects of the present invention also provide variable mode plasma-enhanced processes adapted for (i) removal of photoresist after high-dose ion implant; (ii) post metal etch polymer removal; (iii) via clean; and (iv) other plasma enhanced processes. In each case, modulation of the plasma potential, the process pressures and gases, and the power level and frequency may be selectively varied to allow efficient, high throughput processing with reduced potential for damage to the semiconductor wafer.

BRIEF DESCRIPTION OF THE DRAWINGS

These and other features and advantages of the present invention will become more apparent to those skilled in the art from the following detailed description in conjunction with the appended drawings in which:

FIGS. 3A and 3B illustrate process steps for removal of photoresist after high-dose ion implant in accordance with exemplary embodiments of the present invention;

FIG. 4 illustrates process steps for post metal etch polymer removal in accordance with an exemplary embodiment of the present invention;

FIG. 5 illustrates process steps for via clean in accordance with an exemplary embodiment of the present invention.

DESCRIPTION

Figure 1:
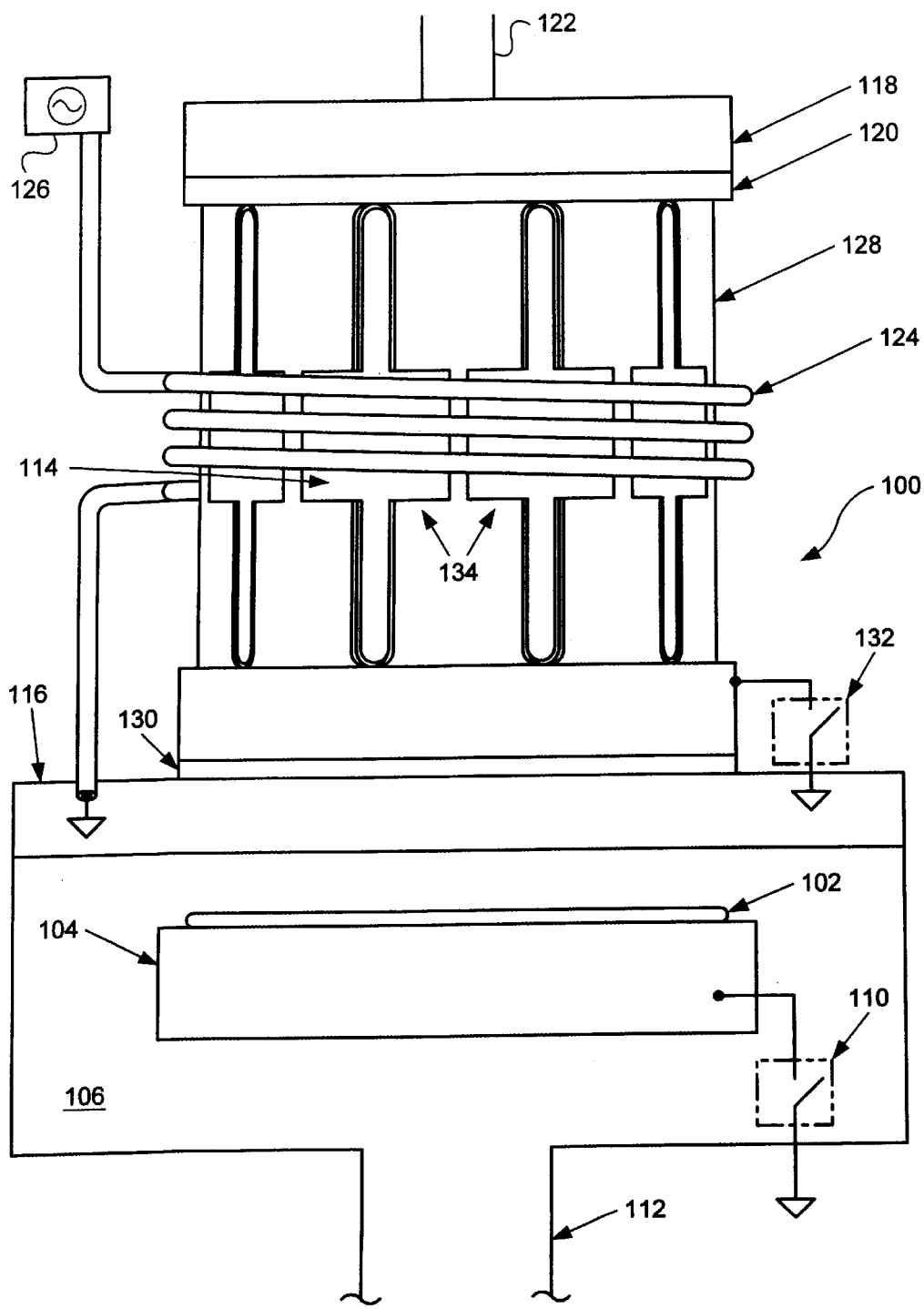
FIG. 1 illustrates an inductively coupled plasma reactor according to an exemplary embodiment of the present invention.

Aspects of the present invention provide a system and method for variable mode plasma-enhanced processing of a semiconductor wafer. In particular, an exemplary embodiment of the present invention may be used to remove photoresist from a semiconductor wafer after high-dose ion implant, for post metal etch polymer removal, for via clean and for other plasma enhanced processes.

In an exemplary embodiment, a semiconductor wafer is placed in a plasma reactor for processing. In one mode, an energetic plasma is formed to produce both charged species and neutral dissociated species. Capacitive coupling is induced between the semiconductor wafer and the plasma and charged species are driven to the surface of the wafer. The bombardment by the charged species and reaction with dissociated neutral species together provide aggressive processing which may be used, for instance, to remove the hard outer crust on photoresist after high-dose ion implant. In this mode, the peak-to-peak modulation of the plasma potential may range from about 30 Volts to 100 Volts, or any range subsumed therein, and forms a sheath near the wafer surface with an average direct current potential of between about 20 Volts and 60 Volts, or any range subsumed therein. This mode of plasma processing may be provided by using an inductively coupled plasma reactor without capacitive shielding, with partial capacitive shielding, or with capacitive shielding that is ungrounded or poorly coupled to ground. In addition, the energy of bombardment by charged species may be enhanced by applying a bias to the wafer holder.

In another mode, the capacitive coupling between the plasma and the semiconductor wafer may be decreased to reduce bombardment by charged species and isolate the plasma from the wafer surface. In this mode, processing is carried out by dissociated neutral species and reduced bombardment by charge particles. In this mode, the peak-to-peak modulation of the plasma potential may range from about 2 Volts to 10 Volts, or any range subsumed therein, and the average direct current potential between the plasma and the wafer may range from about 10 Volts to 15 Volts, or any range subsumed therein. This mode may be provided by using an inductively coupled plasma reactor with a desired level of capacitive shielding.

By varying the amount of capacitive shielding and/or the effective coupling of the shield to ground, the modulation of the plasma potential relative to the wafer may be varied from a very low level of from a few volts to as high as 100 volts or more with effectively no shielding, or any range subsumed therein.

The foregoing techniques allow the plasma potential relative to the wafer surface to be carefully controlled and varied for different process steps. In addition, the processing pressure and gases and power level and frequency may be selectively varied along with the plasma potential to tailor the plasma properties to specific process steps without interrupting processing.

While the exemplary embodiment of the present invention is described below with reference to particular plasma reactor configurations and processes, it will be readily apparent that other configurations and processes may be used in conjunction with aspects of the present invention. Descriptions of additional exemplary reactor configurations and processes which may be used in conjunction with aspects of the present invention are provided in U.S. Pat. No. 5,534,231, U.S. Pat. No. 5,234,529, U.S. patent application Ser. No. 08/340,696 entitled "Inductive Plasma Reactor" filed Nov. 15, 1994 and assigned to the assignee of the present application, U.S. patent application Ser. No. 08/811,893 entitled "ICP Reactor Having a Conically-Shaped Plasma-Generating Section" filed Mar. 5, 1997 and assigned to the assignee of the present invention, and U.S. patent application Ser. No. 08/590,228 entitled "Hydrocarbon-Enhanced Dry Stripping of Photoresist" filed Nov. Jan. 23, 1996 and assigned to the assignee of the present application, each of which is incorporated herein by reference in its entirety. In particular, to enhance throughput and reduce redundancy of components in a commercial embodiment, dual wafer, dual plasma generation chamber configurations as described in U.S. patent application Ser. Nos. 08/340,696, 08/811,893 and 08/590,228 may be used. Additional processes which may be used in connection with aspects of the present invention are described in copending U.S. patent application entitled "Downstream Surface Cleaning Process" by Craig Ranft, Wolfgang Helle, Robert Guerra and Brady F. Cole, being filed concurrently herewith on Nov. 16, 1998, which is incorporated herein by reference.

FIG. 1 illustrates an inductively coupled plasma reactor system 100 used in the exemplary embodiment of the present invention. Referring to FIG. 1, a semiconductor wafer 102 to be processed is placed on an aluminum support 104 in processing chamber 106. Support 104 may be heated or cooled by a heating or cooling system (not shown) to heat or cool wafers for processing. Gases are exhausted from the system through exhaust outlet 112. The support 104 rests on a ceramic stand (not shown) which is slotted to allow gas to escape through outlet 112.

Support 104 may be selectively coupled to ground through switch 110. When the switch is closed, charged particles can be driven to ground through semiconductor wafer 102 and support 104. Thus, when support 104 is grounded, bombardment by charged particles is enhanced. Therefore, switch 110 is typically closed when higher levels of ion bombardment are being used to etch wafer 102. When switch 110 is open, the potential of the support and wafer tend to float at values near the potential of the plasma and ion bombardment is reduced. Therefore, switch 110 is typically open when neutral species and lower levels of bombardment are used to process sensitive areas of the wafer surface. In the exemplary embodiment, switch 110 is a vacuum switch relay to ground which allows the support to be quickly and easily switched between grounded and ungrounded states, In alternative embodiments, support 104 may be selectively coupled to an RF bias to accelerate ions toward the wafer for enhanced processing. See, e.g., U.S. Pat. No. 5,534,231.

A plasma generation chamber 114 is situated above the processing chamber 106. The top plate 116 of the processing chamber 106 provides a common ground for the components of the plasma generation chamber, and comprises a conductive material such as aluminum or the like. The walls of the plasma generation chamber are made of a nonconductive material such as quartz or alumina and have a thickness of approximately 4 to 6 mm. The generation chamber walls are fixed at their base to the top plate 116 of the processing chamber. The top lid 118 of the plasma generation chamber can be aluminum or similar conductive material or can be the same material as the generation chamber walls. An o-ring seal 120 is compressed between top lid 118 and the plasma generation chamber walls to provide a vacuum seal. A gas inlet 122 is provided through top lid 118 to provide gases into plasma generation chamber 114.

An inductor adjacent to the plasma generation chamber, such as induction coil 124, provides power into the plasma generation chamber. In the exemplary embodiment induction coil 124 is a helical coil of copper tubing with three turns encircling the plasma generation chamber. Other inductor configurations with a different size, number of turns or in a different shape, such as a conical or pancake shape, may also be used. Induction coil 124 is connected to a radio frequency (RF) source 126 through an impedance match network or transformer (not shown). Inductively-coupled RF power is typically supplied to the reactor at one of the Industry, Scientific, Medical (ISM) standard frequencies of 13.56, 27.12, 40.68 MHz, or other harmonics of the 13.56 MHz ISM standard frequency. Usually the power is supplied to the coils through an impedance match network or transformer at a frequency in the range from 1 to 27 MHz, although lower frequencies may be used to prevent ion drive-in into the wafer being processed. RF energy is typically applied to the induction coil at a power of between about 900 and 3,000 Watts, or any range subsumed therein.

A split Faraday shield 128 is provided between the induction coil 124 and the plasma generation chamber 114. The bottom of the split Faraday shield 128 sits on an insulating ring 130 which may be used to electrically isolate the shield from the top plate 116 of the processing chamber. Compressed o-ring seals (not shown) are used to provide a vacuum seal. A switch 132 selectively couples the shield to the ground potential provided by the top plate 116.

When the shield is ungrounded, induction coil 124 inductively and capacitively couples power into the plasma generation chamber 114. The inductive coupling tends to accelerate charged particles circumferentially in a plane substantially parallel to the semiconductor wafer. The capacitive coupling modulates the plasma and drives charged particles perpendicularly toward the semiconductor wafer. In addition, the plasma produces neutral dissociated species which diffuse over the semiconductor wafer surface.

When the shield is grounded, it substantially reduces capacitive coupling between the coil and the plasma. While capacitive coupling is reduced, there is still some capacitive coupling through slots 134 formed in the shield. The reduction in capacitive coupling, in turn, reduces the modulation of the plasma potential and the bombardment of the semiconductor wafer by charged particles. Neutral activated species continue to be produced and flow over the wafer surface.

The number and size of the slots formed in the shield may be varied to change the level of capacitive coupling. In the exemplary embodiment, the Faraday shield 128 forms slots which are narrow, about 1 cm wide, along the length of the shield both above and below the coil. However, the slots are much wider in the region adjacent to the turns of the coil. In this region, the width of the slots is typically in the range of from about 2 centimeters to as wide as about 90% of the distance between the slots from center to center, or any range subsumed therein. The region of the shield forming the wider slots is generally aligned transverse to the turns of the helical coil, extending from about 0.5 centimeter to several centimeters below the turns of the coil to about 0.5 centimeter to several centimeters above the turns of the coil. In the exemplary embodiment, for use with 200 mm Silicon wafers, the diameter of the Faraday Shield is about 200 mm with slots about 80 mm in distance from one another from center to center. In this embodiment the width of the slots in the region of the shield adjacent to the turns of the coil is about 6 cm to 6.5 cm.

The purpose of widening the slots in the region near the induction coil is to permit a desired level of capacitive coupling of the coil to the plasma even when the shield is grounded, thereby enhancing the energy transfer to electrons in this region and increasing the rates of ionization and production of excited species in the plasma chamber near the coil. This also serves to drive some RF current through the plasma (on the order of Amperes of current at 13.56 MHz) and modulate the plasma potential to some degree (some tens of Volts at 13.56 MHz). However, the modulation of the plasma potential is not sufficient to cause the plasma to diffuse out of the plasma generation chamber and into the process chamber as long as the Faraday Shield is grounded and able to serve as an RF anode to receive RF currents driven into the plasma by capacitive coupling from the induction coil.

If the Faraday shield is poorly coupled to ground and thereby floats electrically (e.g., with switch 132 open), however, the RF currents coming from the coil into the plasma by capacitive coupling cannot easily return to ground through the shield and must flow elsewhere to grounded surfaces. Such surfaces include support 104 and the walls of the processing chamber, In this case, the plasma expands sufficiently to extend out of the plasma chamber and cover the region above the wafer. A relatively narrow (order of magnitude 5 mm) dark space sheath is formed between the plasma and the wafer. Ions from the plasma accelerate across the sheath and bombard the wafer.

Switch 132 is used to selectively couple the Faraday shield 128 to the ground potential provided by top plate 116. When switch 132 is open, the potential of the shield tends to float and substantial capacitive coupling from the induction coil penetrates the shield. Therefore, switch 132 is typically open when higher levels of ion bombardment are desired for etching wafer 102. When switch 132 is closed, the shield is grounded which substantially reduces capacitive coupling from the induction coil to the plasma. Therefore, switch 132 is typically closed when neutral species are used with lower levels of bombardment to process sensitive areas of the wafer surface. In the exemplary embodiment, switch 132 is a vacuum switch relay to ground which allows the shield to be quickly and easily switched between grounded and ungrounded states.

Figure 2:
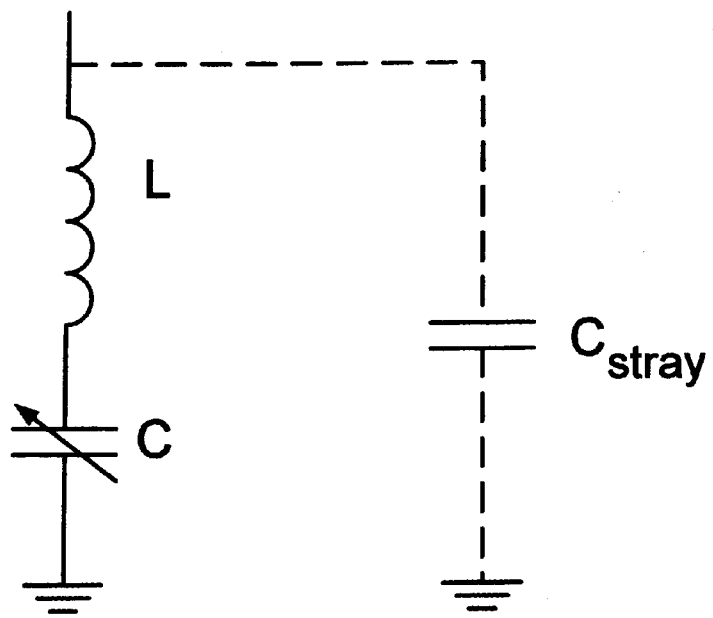
FIG. 2 illustrates a circuit used to provide variable impedances in an alternate embodiment of the present invention.

FIG. 2 illustrates a sample circuit which may be used to provide switches 110 and 132 in alternate embodiments of the present invention. Switch 110 may be formed by providing a circuit with a variable impedance between the support 104 and a ground potential. The switch is open when the circuit is tuned to provide a high impedance of the support to ground at the frequency of excitation. The variable impedance may be provided by a series LC circuit, as shown in FIG. 2, inserted between the support and a ground potential. The capacitance C is provided by a variable capacitor to allow the impedance of the circuit to be varied. The capacitance C is selected taking into account stray capacitance, $C_{stray}$, between the aluminum block and the other elements of the plasma reactor chamber. When a high impedance is desired, the variable capacitor is tuned so the circuit provides an effective inductance in parallel resonance with the stray capacitance, $C_{stray}$, at the frequency of excitation. When a low impedance is desired, the variable capacitor is tuned to be in series resonance with inductance L at the frequency of excitation. For RF power of between about 500 to 1,500 Watts at 13.56 MHz, values for inductance L may range from about 0.1 to 2.0 microhernry and the value for capacitance C may be adjustable up to about 50 to 1,000 picofarads.

Switch 132 may be formed by providing a similar series LC circuit with a variable impedance between the shield 128 and ground. The capacitor is variable, and the capacitance is selected taking into account stray capacitance, $C_{stray}$, between the shield and other elements of the reactor. As described above, a high or low impedance may be provided by tuning the circuit to parallel resonance with $C_{stray}$, for high impedance and to series resonance for low impedance.

Exemplary parameters for processing a semiconductor wafer in the reactor of FIG. 1 will now be described. Initially, the chamber is at a pressure of about 3–10 Torr. Any processed wafer remaining in the chamber from previous processing is removed and a new wafer is placed on support 104. A robot and load lock mechanism (not shown) such as that provided by the Aspen™ system available from Mattson Technology, Inc. are used to load and unload the semiconductor wafers. After the load lock door is closed, the chamber is evacuated to the desired process pressure and process gases are flowed through inlet 122 into plasma generation chamber 114. The wafer is allowed to heat up to the desired processing temperature and gas flows are stabilized during an initial period of from several to about 10 seconds.

Typically, the gas combinations employed for photoresist removal include: Oxygen, Carbon Tetrafluoride (or other fluorocarbon or partially fluorinated hydrocarbon) and Hydrogen gas (which may be provided in a dilute mixture in an inert gas such as Nitrogen or Argon) or Hydrogen containing gases such as $C_4H_{10}$ or $CH_3OH$ or $H_2O$. The relative flows of the different gases range from hundreds of SCCM (standard cubic centimeters per minute) to ten thousand SCCM for Oxygen; from five SCCM to one thousand SCCM for fluorocarbon; and from ten SCCM to five thousand SCCM of Hydrogen diluted in inert gas. The total pressure of the gas ranges from a few hundred milliTorr to as much as several Torr.

In one exemplary embodiment the initial pressure is approximately 500–700 milliTorr and the flows are: Oxygen at about 1,500 SCCM, $CF_4$ at about 90 SCCM, and Hydrogen 4% in Nitrogen at about 1,500 SCCM. The support 104 is kept at a temperature of less than 100 degrees Celsius, with about 85 degrees Celsius being typical. Alternate process parameters are described further below and in U.S. patent application Ser. No. 08/590,228, which is incorporated herein by reference.

Initially, switch 132 is open and the shield is ungrounded. After gas flows and temperatures are stabilized, RF power at 13.56 MHz is provided to induction coil 124 and the plasma is ignited in plasma generation chamber 114. The plasma produces charged particles and neutral species. The plasma generated by the induction electric field couples capacitively to the Faraday Shield through the insulating vessel and picks up some fraction of the RF electric current which has been coupled from coil 124 to the shield. This causes the electrical potential of the plasma to be modulated at the RF frequency of the current in the coil. The plasma then conducts the current which it has picked up to grounded surfaces, such as the walls of the processing chamber and support 104 which holds the semiconductor wafer. The conduction of the RF current to the wafer which rests on support 104 causes current to pass also through the wafer and sets up a plasma sheath above the wafer. This sheath serves to accelerate positively charged ions toward the photoresist crust on the wafer surface. The bombardment by these ions is an important factor in various etching processes, because it promotes the breaking of bonds for materials to be etched on the wafer surface.

The system is operated in this high energy mode for between about 1 to 5 minutes as necessary to etch away the hard photoresist crust, with 3 to 3½ minutes being typical. Empirical data for a given process may be used to determine the time necessary for sufficiently etching the crust. Alternatively an optical end point detection method may be used. The photon emissions from the surface of the wafer change as the crust is etched away. Therefore an optical sensor, such as an optical pyrometer, may be used to determine how much of the crust has been removed. Typically, after the crust has been removed, the photoresist continues to be etched in the high energy mode for a period of about 30 seconds. This overetching ensures that all of the crust has been removed and also begins removing the soft underlying resist. In sensitive processes, the high energy mode may be stopped earlier to ensure that the photoresist is not prematurely etched away on some parts of the wafer leaving the bare wafer exposed to high energy ion bombardment.

When the ion bombardment phase of the process is concluded and remaining materials or residues are to be processed in a less aggressive manner, the shield switch 132 is closed which causes the shield to be grounded. This in turn removes the RF current from the shield, and prevents this current from conducting into the plasma. The lack of RF current conducting through the plasma causes the plasma to retract from the processing chamber back into the plasma generation chamber. This substantially reduces the conduction of current to the wafer and hence the sheath which accelerates the ions toward the surface of the wafer. Therefore, the energy of ions bombarding the wafer is significantly reduced and the system operates in a low energy mode. In addition, switch 110 may be opened to further reduce current flow to the wafer. This provides a less aggressive plasma process for removing photoresist from the wafer, because energetic ion bombardment is substantially eliminated. Reactive neutral species, on the other hand, continue to be produced and flow to the surface of the semiconductor surface. The neutral species readily react with and remove the soft photoresist without high energy ion bombardment.

During the low energy mode, the process gases may be changed slightly to reduce aggressive fluorine containing compounds and increase neutral oxygen species. For instance, the pressure may be increased to approximately 1 to 1.1 Torr which reduces ion density and the flows may be modified to about: Oxygen at about 3,000 SCCM, $CF_4$ at about 60 SCCM, and Hydrogen 4% in Nitrogen at about 1,500 SCCM.

The system may be operated in the low energy mode until all of the soft underlying resist is removed. In addition, an overetch may be performed to ensure that all of the photoresist is removed. Even though the surface of the wafer is exposed during overetch, the potential for damage is reduced due to the low level of ion bombardment. In a typical process, the soft photoresist is removed in about a minute and about 30 seconds of overetch is performed.

After the photoresist has been removed, the RF power is turned off and the process gases are turned off. Nitrogen gas is flowed to purge the chamber and the pressure is raised to about 3–10 Torr. The processed wafer may then be removed and a new wafer may be placed in the chamber.

Additional exemplary processes will now be described with reference to FIGS. 3–5. FIGS. 3A and 3B illustrate process steps and parameters used for low temperature removal of photoresist after high-dose ion implant (hereinafter "HDIS process"). These processes are adapted to allow fast removal of photoresist with minimum oxide loss and without causing popping on the wafer. These goals are achieved by running at low temperature (lower than the baking temperature of about 160° C.) with different chemistries than typical conventional systems and by using variable mode plasma-enhanced processing.

FIG. 3A illustrates an HDIS process which provides a relatively fast process, but may result in some oxide loss.

During step 1, a wafer with photoresist hardened by high-dose ion implant is placed in the processing chamber. The wafer also includes thin oxide layers which are not intended to be etched away by the process. Step 1 of the process has a short duration of only about 5 seconds and is used to stabilize conditions in the processing chamber. Initially, the pressure of the processing chamber is about 8 Torr. Gases are flowed at the following rates: oxygen ($O_2$) at about 5,000 SCCM, forming gas of 4% hydrogen ($H_2$) in Argon (Ar) at about 1,400 SCCM and $CF_4$ at about 90 SCCM. The temperature of support 104 is maintained at about 85 degrees Celsius throughout the process. The shield is ungrounded and switch 132 is open. RF power is not applied during this step.

During step 2, the pressure is reduced to about 1.1 Torr and gases are flowed at the following rates: oxygen ($O_2$) at about 1,500 SCCM, forming gas of 4% hydrogen ($H_2$) in Argon (Ar) at about 1,400 SCCM and $CF_4$ at about 90 SCCM. The shield remains ungrounded. After a delay of about 10 seconds after the start of step 2, RF power is applied to induction coil 124 at a frequency of 13.56 MHz and a power level of about 800 Watts. During this step, an energetic plasma is ignited and the hardened photoresist crust is etched by ion bombardment. The plasma extends into the processing chamber and forms a sheath at the wafer surface. Step 2 has an overall duration of about 85 seconds.

During step 3, the pressure is reduced to about 0.6 Torr and gases are flowed at the following rates: oxygen ($O_2$) at about 1,500 SCCM, forming gas of 4% hydrogen ($H_2$) in Argon (Ar) at about 1,400 SCCM and $CF_4$ at about 90 SCCM. Switch 132 is closed and the shield is grounded. At the same time, RF power is increased to a power level of about 1,100 Watts. During this step, the plasma retracts into the plasma generation chamber, which reduces energetic ion bombardment even though pressure is reduced and power is increased. The reduced pressure and increased power cause the plasma to produce abundant dissociated neutral species which diffuse over the wafer surface, while the shield reduces capacitive coupling and ion bombardment. Step 3 has an overall duration of about 75 seconds. During step 4, the RF power is turned off and pressure is raised to about 8 Torr. Oxygen is ($O_2$) is flowed at about 5,000 SCCM. The other gases are turned off. Step 4 has a duration of about 5 seconds, after which the processed wafer is removed. The overall process has a duration of about 170 seconds. This results in a throughput of about 15 wafers per hour in a single wafer reactor and about 35 wafers per hour in a dual wafer reactor.

FIG. 3B illustrates an HDIS process which is slightly slower than the process described above, but results in almost no oxide loss. During step 1, a wafer with photoresist hardened by high-dose ion implant is placed in the processing chamber. The wafer also includes thin oxide layers which are not intended to be etched away by the process. Step 1 of the process has a short duration of only about 5 seconds and is used to stabilize conditions in the processing chamber. Initially, the pressure of the processing chamber is about 8 Torr. Gases are flowed at the following rates: oxygen ($O_2$) at about 2,300 SCCM, forming gas of 4% hydrogen ($H_2$) in Nitrogen ($N_2$) at about 600 SCCM and $CF_4$ at about 90 SCCM. The temperature of support 104 is maintained at about 85 degrees Celsius throughout the process. The shield is ungrounded and switch 132 is open. RF power is not applied during this step.

During step 2, the pressure is reduced to about 1.1 Torr and gases are flowed at the following rates: oxygen ($O_2$) at about 2,300 SCCM, forming gas of 4% hydrogen ($H_2$) in Nitrogen ($N_2$) at about 600 SCCM and $CF_4$ at about 90 SCCM. The shield remains ungrounded. After a delay of about 10 seconds, RF power is applied to induction coil 124 at a frequency of 13.56 MHz and a power level of about 1,000 Watts. During this step, an energetic plasma is ignited and the hardened photoresist crust is etched by ion bombardment. The plasma extends into the processing chamber and forms a sheath at the wafer surface. Step 2 has an overall duration of about 115 seconds.

During step 3, the pressure is reduced to about 0.6 Torr and gases are flowed at the following rates: oxygen ($O_2$) at about 2,300 SCCM, forming gas of 4% hydrogen ($H_2$) in Nitrogen ($N_2$) at about 600 SCCM and $CF_4$ at about 90 SCCM. Switch 132 is closed and the shield is grounded. At the same time, RF power is increased to a power level of about 1,200 Watts. During this step, the plasma retracts into the plasma generation chamber, which reduces energetic ion bombardment even though pressure is reduced and power is increased. The reduced pressure and increased power cause the plasma to produce abundant dissociated neutral species which diffuse over the wafer surface, while the shield reduces capacitive coupling and ion bombardment. Step 3 has an overall duration of about 75 seconds.

During step 4, the RF power is turned off and pressure is raised to about 8 Torr. Oxygen ($O_2$) is flowed at about 5,000 SCCM. The other gases are turned off. Step 4 has a duration of about 5 seconds, after which the processed wafer is removed. The overall process has a duration of about 200 seconds. This results in a throughput of about 12 wafers per hour in a single wafer reactor and about 30 wafers per hour in a dual wafer reactor.

FIG. 4 illustrates process steps and parameters used for post metal etch polymer removal. This process is adapted for removing sidewall polymer that remains after metal etch and dry strip of photoresist. Metal etch processes are anisotropic due to the generation of sidewall material (referred to as polymer). This material is composed of Carbon, Chlorine, Aluminum, and may also contain Boron oxides and chlorides from the BC 13 etch gas additive. Typical integrated ash processes are developed with the goal of eliminating corrosion of the aluminum lines due to the presence of chlorine in the polymer. These processes have good corrosion resistance yet poor polymer removal. The process described below removes the polymer and eliminates the need for organic solvents or acidic treatments which are commonly used for the same purpose. By going to an all-dry process with only a de-ionized water rinse, significant cost savings can be realized.

During step 1, a wafer is placed in the processing chamber. Step 1 of the process has a short duration of only about 6 seconds and is used to stabilize conditions in the processing chamber. Initially, the pressure of the processing chamber is about 1.1 Torr. Gases are flowed at the following rates: forming gas of 4% hydrogen ($H_2$) in Nitrogen ($N_2$) at about 500 SCCM and $CF_4$ at about 300 SCCM. It should be noted that oxygen gas is not flowed to the chamber during step 1. TiN or Ti barrier and ARC layers are susceptible to attack in the presence of fluorine and oxygen, if exposure applies in the first step. The temperature of support 104 is maintained at about 75 degrees Celsius throughout the process. The etch induced polymer material apparently oxidizes at higher temperatures (e.g., above 100° C.), rendering the polymer more difficult to remove. The shield is ungrounded and switch 132 is open. After a delay of about 4 seconds RF power is applied at a frequency of 13.56 MHz and a power level of about 850 Watts, During this step, an energetic plasma is ignited and established. The plasma extends into the processing chamber and forms a sheath at the wafer surface.

During step 2, the pressure is increased to about 2.5 Torr and gases are flowed at the following rates: forming gas of 4% hydrogen ($H_2$) in Nitrogen ($N_2$) at about 1,900 SCCM and $CF_4$ at about 300 SCCM. The shield remains ungrounded. RF power is lowered to about 650 Watts. During this step, polymer is etched by ion bombardment. Step 2 has an overall duration of about 20 seconds.

During step 3, the pressure is reduced to about 0.6 Torr and gases are flowed at the following rates: oxygen ($O_2$) at about 3,000 SCCM, and $CF_4$ at about 150 SCCM. Switch 132 is closed and the shield is grounded. At the same time, RF power is increased to a power level of about 1,150 Watts. During this step, the plasma retracts into the plasma generation chamber, which reduces energetic ion bombardment even though pressure is reduced and power is increased. The reduced pressure and increased power cause the plasma to produce abundant dissociated neutral species which diffuse over the wafer surface for bulk resist strip, while the shield reduces capacitive coupling and ion bombardment. Step 3 has an overall duration of about 46 seconds.

During step 4, the pressure is raised to about 2.5 Torr and gases are flowed at the following rates: forming gas of 4% hydrogen ($H_2$) in nitrogen ($N_2$) at about 1,900 SCCM and $CF_4$ at about 300 SCCM. The shield is ungrounded. At the same time, RF power is decreased to a power level of about 650 Watts. During this step, residue is removed by ion bombardment. The plasma extends into the processing chamber and forms a sheath at the water surface. Step 4 has an overall duration of 30 seconds.

During step 5, pressure is decreased to about 1.1 Torr. Oxygen is ($O_2$) is flowed at about 3,500 SCCM. The other gases are turned off and the shield is ungrounded. Step 5 has a duration of about 5 seconds, after which the processed wafer is removed. The overall process has a duration of about 107 seconds. This results in a throughput of about 25 wafers per hour in a single wafer reactor and about 50 wafers per hour in a dual wafer reactor.

FIG. 5 illustrates process steps and parameters used for via veil removal. This process is adapted for removing tough via veils that are generated from oxide etch processes. The purpose of the process is to open a conductive pathway to the Aluminum underlayer. This etch process is designed to remove only the oxide material under the opened mask layer. In order to provide anisotropy during the etch, polymerizing process chemistries are used in conjunction with sufficient ion bombardment to passivate the etched sidewall. Once this oxide layer is opened and cleaned, subsequent steps deposit metal contacts which allow vertical integration of devices. In this way lateral space is conserved, allowing for more densely-packed transistor layers and metal interconnect layers. Unlike typical conventional processes, the process described below removes both the bulk photoresist masking layer and the via sidewall polymer material without the use of solvents or aggressive acidic solutions. This provides significant cost savings.

In addition, the process described below is carried out at relatively low temperatures of from about 25 to 75 degrees Celsius. TiN or Ti ARC layers are susceptible to attack at higher temperatures of 250° C., but not in the 25 to 75° C. temperature range used in the current process. SOG layer attack is also seen at higher temperatures, resulting in profile distortion of the via. In addition, the etch induced polymer material oxidizes at higher temperatures rendering the polymer more difficult to remove. If the polymer film contains aluminum due to exposure of aluminum layers during the etch process, it can be easily oxidized to $Al_2O_3$ rendering the film even more difficult to remove. The process described below, on the other hand, is carried out at low temperatures and is capable of yielding clean vias with only a de-ionized water rinse.

During step 1, a wafer is placed in the processing chamber. Step 1 of the process has a short duration of only about 5 seconds and is used to stabilize conditions in the processing chamber. Initially, the pressure of the processing chamber is about 8 Torr. Gases are flowed at the following rates: Oxygen ($O_2$) at about 5,000 SCCM. The temperature of support 104 is maintained at about 25 to 70 degrees Celsius throughout the process with 25 degrees Celsius being typical. The shield is ungrounded and switch 132 is open. RF power is not applied during this step.

During step 2, the pressure is maintained at about 0.7 Torr and gases are flowed at the following rates: oxygen ($O_2$) at between 1,000 to 4,000 SCCM with 3,000 SCCM being typical, fluorine containing gases ($CF_4$ or $NF_3$) from 1% to 3%, with 30 SCCM of $NF_3$ being typical. The shield remains ungrounded. After a delay of about 10 seconds, RF power is applied to induction coil 124 at a frequency of 13.56 MHz and a power level of between 700 to 1,000 Watts with 800 Watts being typical. During this step, polymer is etched by ion bombardment. The plasma extends into the processing chamber and forms a sheath at the wafer surface. Step 2 has a duration of about 75 seconds.

During step 3, the RF power is turned off and pressure is raised to 8 Torr, Oxygen ($O_2$) is flowed at 5,000 SCCM. The other gas is turned off. Step 3 has a duration of about 5 seconds after which the processed wafer is removed. The overall process has a duration of about 90 seconds. This results in a throughout of about 60 wafers per hour in a single wafer reactor and about 100 wafers per hour in a dual wafer reactor.

The above described embodiments are exemplary only. It is understood that any variety of plasma reactors and process parameters may be used in conjunction with aspects of the present invention. For instance, high and low energy modes could be provided in two separate chambers and a semiconductor wafer could be moved between the high energy chamber and the low energy chamber for different process steps. A reactor with an energetic plasma, such as a capacitive diode reactor or an unshielded or partially shielded inductively coupled reactor, could be used to remove hardened layers of material. A reactor with a lower energy plasma isolated from the semiconductor wafer surface, such as a shielded inductively coupled reactor with a charged particle filter (see U.S. patent application Ser. No. 08/340,696), could be used to remove sensitive layers. The wafer support in the second chamber could be hotter than in the first chamber, because problems with photoresist popping are reduced after the crust is removed (see U.S. patent application Ser. No. 08/590,228).

In addition, other mechanisms for varying capacitive shielding and plasma modulation may be used. For instance, a shield may be moved radially away from the reactor chamber to increase the size of the slots and decrease the level of shielding. In addition, the shield may be raised or lowered to remove all or part of the shielding. The width of the slots in the shield may also be increased or decreased by rotating an inner shield to overlap a portion of the slots. A sliding door or other mechanism may also be used. An RF bias may also be selectively applied to the wafer support at varying power levels and frequencies to vary capacitive coupling and the plasma sheath above the wafer surface. In addition, the shield may be selectively coupled to an RF bias to induce capacitive coupling.

Figure 6A:
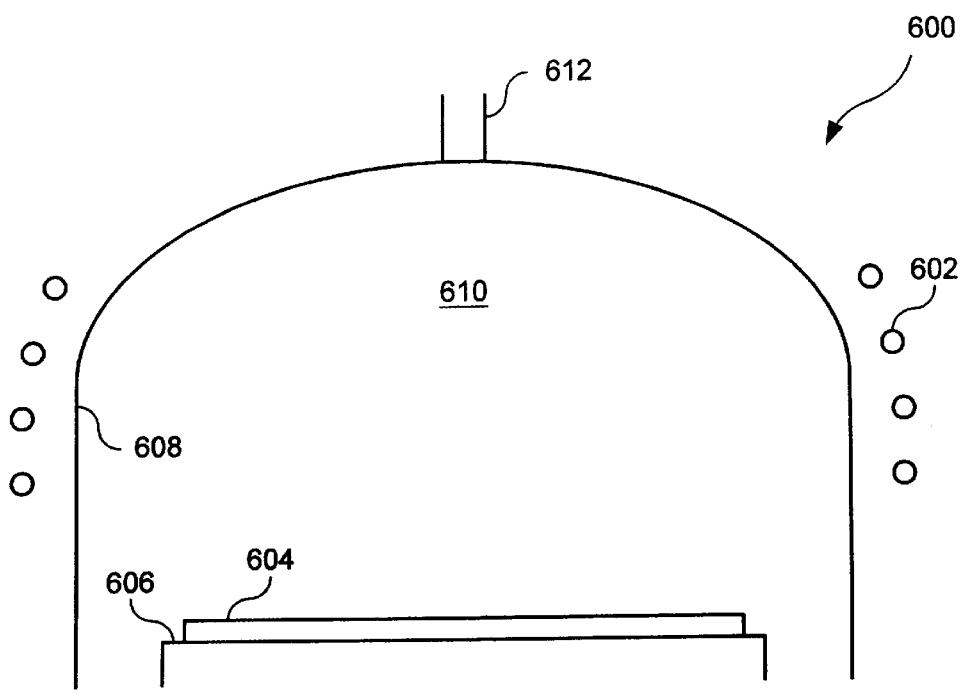
FIGS. 6A and 6B illustrate an inductively coupled plasma reactor with a movable inductor according to an alternate embodiment of the present invention.
Figure 6B:
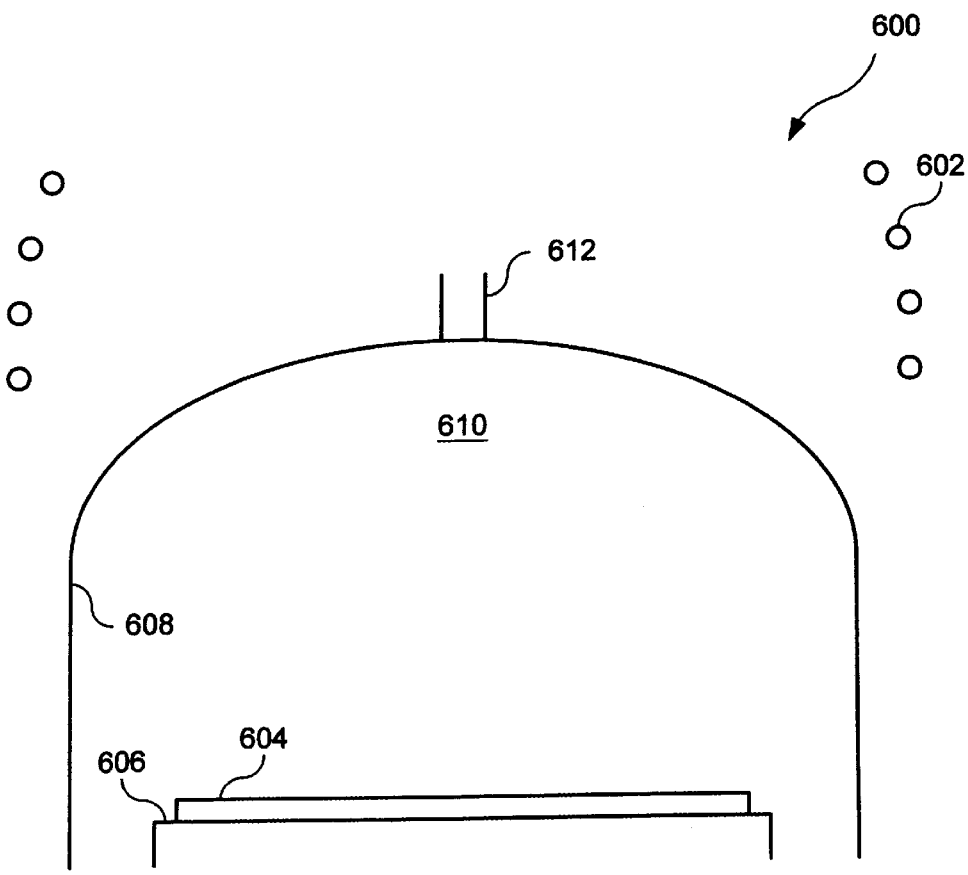

Capacitive coupling and/or modulation of the plasma potential may also be modified in some embodiments without the use of variable capacitive shielding. FIGS. 6A and 6B illustrate an alternate embodiment with a movable inductor for varying capacitive coupling. FIG. 6A shows a reactor 600 with a plasma generation chamber 610 having a non-conductive wall 608. A wafer 604 is placed on a support 606 for processing. Gas is provided through inlet 612. RF power is applied to inductor 602 to couple power into the chamber both inductively and capacitively.

FIG. 6B shows an alternate configuration of reactor 600 for a processing mode with reduced capacitive coupling. Inductor 602 is raised above chamber 610 which reduces capacitive coupling. Inductive fields extending radially below inductor 602 sustain the plasma in chamber 610. The power applied to inductor 602 may be increased to sustain the plasma. Nevertheless, capacitive coupling is reduced thereby providing an alternate mode of processing.

Aspects of the present invention may also be used for other plasma-enhanced processes such as low temperature de-scum and post passivation-etch photoresist stripping, although the process gases, pressures, power and temperatures may differ. For instance, for certain processes, pulsed power may be applied to the induction coil and/or wafer support. See U.S. patent application Ser. No. 08/727,209 entitled "Apparatus and Method for Pulsed Plasma Processing of a Semiconductor Substrate" filed Oct. 8, 1996, assigned to the assignee of the present application and incorporated herein by reference in its entirety.

While this invention has been described and illustrated with reference to particular embodiments, it will be readily apparent to those skilled in the art that the scope of the present invention is not limited to the disclosed embodiments but, on the contrary, is intended to cover numerous other modifications and equivalent arrangements which are included within the spirit and scope of the following claims.

We claim:

1. A plasma reactor for processing a semiconductor wafer comprising:
    a reactor chamber within which a plasma is generated to produce plasma products for processing the semiconductor wafer wherein the plasma products include charged particles and neutral species;
    a gas inlet through which gas is provided to the reactor chamber;
    an electrode adjacent to the plasma;
    a power source operatively coupled to the electrode to provide power to the plasma;
    a support for the semiconductor wafer positioned such that the wafer is exposed to at least one plasma product during processing; and
    a shield system configured to selectively provide a first level and a second level of capacitive shielding between the power source and the plasma, the shield system configured to provide the first level of capacitive shielding to induce bombardment of the semiconductor wafer by charged particles from the plasma at a desired level for processing the semiconductor wafer during a first period of time and to provide the second level of capacitive shielding to substantially reduce bombardment of the semiconductor wafer by charged particles for processing the semiconductor wafer during a second period of time.

2. The reactor of claim 1, wherein the gas includes a hydrogen containing gas, an oxygen containing gas, and a halogen containing gas.

3. The reactor of claim 2, wherein the halogen containing gas includes fluorine.

4. The reactor of claim 2, wherein the hydrogen containing gas includes a mixture of molecular nitrogen with molecular hydrogen containing about 4% molecular hydrogen.

5. The reactor of claim 2, wherein the gas is provided to the reactor chamber at a flow rate of 100 SCCM to 10,000 SCCM for the oxygen containing gas, 5 SCCM to 1,000 SCCM for the halogen containing gas, and 10 SCCM to 5,000 SCCM of the hydrogen containing gas.

6. A method for processing a semiconductor wafer comprising:
    generating a plasma to produce charged particles and neutral species;
    processing the semiconductor wafer in a first mode of processing using a first level of capacitive shielding during a first period of time, the first mode inducing bombardment of the semiconductor wafer by charged particles from the plasma at a first level for the first mode of processing; and
    processing the semiconductor wafer in a second mode of processing using a second level of capacitive shielding during a second period of time, the second mode limiting bombardment of the semiconductor wafer to a level substantially less than the first level of bombardment for the second mode of processing, the first level of capacitive shielding being different than the second level of capacitive shielding.

7. The method of claim 6, wherein the plasma includes a halogen, oxygen, and hydrogen.

8. The method of claim 7, wherein the halogen includes fluorine.

9. The method of claim 6, wherein generating the plasma includes flowing gas at a flow rate of 100 SCCM to 10,000 SCCM for an oxygen containing gas, 5 SCCM to 1,000 SCCM for a halogen containing gas, and 10 SCCM to 5,000 SCCM for a hydrogen containing gas.

10. The method of claim 6, wherein inducing bombardment of the semiconductor wafer by charged particles from the plasma at a first level is performed for a period of 1 to 5 minutes.

11. The method of claim 6, comprising maintaining the semiconductor wafer at a temperature below about 100 degrees Celsius.

12. The system of claim 1, wherein the shield system is configured to substantially unground the capacitive shield during the first period of time and to substantially ground the capacitive shield during the second period of time.

13. The system of claim 12, wherein the power source is configured to increase the power supplied to the plasma during the second mode relative to the first mode.

14. The system of claim 1, wherein the shield system is configured to supply an RF bias to the capacitive shield during the first mode and to substantially ground the capacitive shield during the second mode.

15. The system of claim 1, wherein the first mode processes a first layer of the semiconductor substrate an d the second mode processes a second layer of the semiconductor substrate.

16. The system of claim 15, wherein the first layer comprises a photoresist crust hardened from high dose ion implantation and the second layer comprises bulk photoresist.

17. The system of claim 1, wherein the shield system provides the first layer of capacitive shielding for a duration of at least 1 minute and then provides the second level of capacitive shielding for a duration of at least 1 minute.

18. The method of claim 6, wherein the first mentioned step of processing comprises substantially ungrounding a capacitive shield and the second mentioned step of processing comprises substantially grounding the capacitive shield.

19. The method of claim 6, wherein the first mentioned step of processing comprises applying an RF bias to a capacitive shield and the second mentioned step of processing comprises substantially grounding the capacitive shield.

20. The method of claim 6, further comprising increasing RF power supplied to the plasma during the second mode relative to the first mode.

21. The method of claim 6, further comprising reducing the pressure in a processing chamber during the second mode relative to the first mode.

22. The method of claim 6, further comprising increasing oxygen supplied to the processing chamber during the second mode relative to the first mode.

23. The method of claim 6, wherein the first layer comprises a photoresist crust hardened from high dose ion implantation, and the second layer comprises bulk photoresist.

24. A method for processing a semiconductor wafer having a first layer and a second layer to be processed, the method comprising:

generating a plasma to produce at least one plasma product in a chamber;

supporting the semiconductor wafer such that the semiconductor wafer is exposed to the at least one plasma product for processing;

varying modulation of the plasma potential relative to the semiconductor wafer to process the first layer of the semiconductor wafer in accordance with a first mode and to process the second layer of the semiconductor wafer in accordance with a second mode, the second mode having a lower plasma potential relative to the semiconductor wafer than the first mode; and wherein the step of varying modulation of the plasma potential comprises using a first level of shielding of a capacitive shield in the first mode and a second level of shielding of the capacitive shield in the second mode.

25. The method of claim 24, wherein the step of varying modulation of the plasma potential further comprises substantially ungrounding the capacitive shield during the first mode and substantially grounding the capacitive shield during the second mode.

26. The method of claim 24, wherein the step of varying modulation of the plasma potential comprises applying an RF bias to the capacitive shield during the first mode and substantially grounding the capacitive shield during the second mode.

27. The method of claim 24, wherein the peak-to-peak modulation of the plasma in the first mode is about 30 to 100 volts and the peak-to-peak modulation of the plasma in the second mode is about 2 to 10 volts.

28. The method of claim 24, further comprising increasing RF power supplied to the plasma during the second mode relative to the first mode.

29. The method of claim 28, further comprising reducing the pressure in the processing chamber during the second mode relative to the first mode.

30. The method of claim 28, further comprising increasing oxygen supplied to the processing chamber during the second mode relative to the first mode.

31. The method of claim 24, wherein the first layer comprises a photoresist crust hardened from high dose ion implantation, and the second layer comprises bulk photoresist.

32. The method of claim 31, wherein processing in the first mode is performed for about 1 to 3 minutes and processing in the second mode is performed for about 1 minute, and wherein processing in the first mode is performed before processing in the second mode.

33. A system for processing a semiconductor wafer, the system comprising:

a reactor chamber within which a plasma is generated to produce plasma products for processing the semiconductor wafer;

a gas supply system configured to supply a gas to the reactor chamber;

a power source configured to provide power to the plasma;

a support for the semiconductor wafer positioned such that the wafer is exposed to at least one plasma product during processing;

a capacitive shield circumferentially surrounding the plasma; and circuitry configured to vary modulation of the plasma potential relative to the semiconductor wafer by varying the level of shielding of the capacitive shield to process a first layer of the semiconductor wafer in accordance with a first mode and to process second layer of the semiconductor wafer in accordance with a second mode, the second mode having a lower plasma potential relative to the semiconductor wafer than the first mode.

34. The system of claim 33, wherein the circuitry is configured to substantially unground the capacitive shield during the first mode and to substantially couple the capacitive shield to round during the second mode.

35. The system of claim 33, wherein the circuitry is configured to apply an RF bias to the capacitive shield during the first mode and to substantially couple the capacitive shield to ground during the second mode.

36. The system of claim 33, wherein the circuitry is further configured to increase power supplied to the plasma during the second mode relative to the first mode.

37. The system of claim 36, wherein the gas supply system is configured to reduce the pressure in the processing chamber during the second mode relative to the first mode.

38. The system of claim 37, wherein the gas supply system is further configured to increase oxygen supplied to the processing chamber during the second mode relative to the first mode.

39. The system of claim 24, wherein the first layer comprises a photoresist crust hardened from high dose ion implantation and the second layer comprises bulk photoresist.

40. A plasma processing system for processing a semiconductor substrate, the system comprising:

a processing chamber for producing the plasma;

a gas supply for providing a gas to the processing chamber;

an induction coil surrounding at least a portion of the processing chamber;

a power source coupled to the induction coil such that the induction coil couples power into the gas mixture to produce the plasma;

a substrate support for supporting the substrate, the substrate support being positioned adjacent to the plasma;

a capacitive shield between the induction coil and the plasma;

a circuit between the capacitive shield and a reference potential configured in at least a first mode of operation for the shield and a second mode of operation for the shield during processing of the semiconductor wafer, the level of capacitive shielding being substantially different between the first mode and the second mode; and the circuit being configured to process the semiconductor substrate in the first mode for at least one minute and in the second mode for at least one minute.

* * * * *